(12) United States Patent
Nelson

(10) Patent No.: US 8,918,985 B1
(45) Date of Patent: Dec. 30, 2014

(54) MODULAR MOUNTING AND INPUT/OUTPUT

(75) Inventor: Eric G. Nelson, Wayne, NJ (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 244 days.

(21) Appl. No.: 13/468,343

(22) Filed: May 10, 2012

Related U.S. Application Data

(60) Provisional application No. 61/484,427, filed on May 10, 2011, provisional application No. 61/486,798, filed on May 17, 2011.

(51) Int. Cl.
*H01R 43/26* (2006.01)

(52) U.S. Cl.
USPC .............................. 29/592.1; 29/834; 29/854

(58) Field of Classification Search
USPC ........ 29/834, 592.1, 832, 854, 855, 875, 825; 439/620.22, 638, 639, 650, 76.1
See application file for complete search history.

(56) References Cited

U.S. PATENT DOCUMENTS

| | | | | |
|---|---|---|---|---|
| 3,551,874 A | * | 12/1970 | Volinskie | 439/63 |
| 4,045,868 A | * | 9/1977 | Ammon et al. | 29/845 |
| 4,195,893 A | * | 4/1980 | Stupay | 439/497 |
| 4,424,931 A | * | 1/1984 | Lovrenich | 228/180.1 |
| 4,580,869 A | * | 4/1986 | Demurjian | 439/736 |
| 4,585,284 A | * | 4/1986 | Koser et al. | 439/77 |
| 4,776,804 A | * | 10/1988 | Johnson et al. | 439/62 |
| 4,781,600 A | * | 11/1988 | Sugiyama et al. | 439/45 |
| 4,810,215 A | * | 3/1989 | Kaneko | 439/845 |
| 4,881,902 A | * | 11/1989 | Papa et al. | 439/76.1 |
| D305,224 S | * | 12/1989 | Iwashita | D13/147 |
| 5,317,105 A | * | 5/1994 | Weber | 174/355 |
| 5,622,506 A | * | 4/1997 | Hornig et al. | 439/74 |
| 5,636,998 A | * | 6/1997 | Daly et al. | 439/76.1 |
| 5,689,401 A | * | 11/1997 | Shikano | 361/679.4 |
| 6,146,153 A | * | 11/2000 | Koradia et al. | 439/76.1 |
| 6,319,066 B2 | * | 11/2001 | Kuo | 439/638 |
| 6,511,328 B2 | * | 1/2003 | Molus et al. | 439/76.1 |
| 6,560,099 B1 | * | 5/2003 | Chang | 361/679.4 |
| 6,945,821 B2 | * | 9/2005 | Stoner et al. | 439/638 |
| 8,657,630 B1 | * | 2/2014 | Nelson et al. | 439/639 |
| 2010/0240250 A1 | * | 9/2010 | Crotinger et al. | 439/535 |
| 2011/0039429 A1 | * | 2/2011 | Mizukami et al. | 439/83 |

\* cited by examiner

*Primary Examiner* — Peter DungBa Vo
*Assistant Examiner* — Kaying Kue
(74) *Attorney, Agent, or Firm* — Sand & Sebolt; Daniel J. Long

(57) ABSTRACT

A system and method for connecting an advanced electronic module to a legacy chassis is presented. A method includes removing a legacy module from the legacy chassis. The legacy module is an older module that communicates with legacy chassis through at least two legacy module connectors on the legacy module and at least two chassis connectors on the legacy chassis. Next, a connector plate with a front side and a back side is attached to the improved electronic module that communicates to the font side of the connector plate with fewer that the at least two legacy module connectors. The method attaches the connector plate and the improved electronic module to legacy chassis so that an equal a number of connectors on the back side of the connector plate communicate with an equal number of legacy chassis connectors on the legacy chassis.

9 Claims, 6 Drawing Sheets

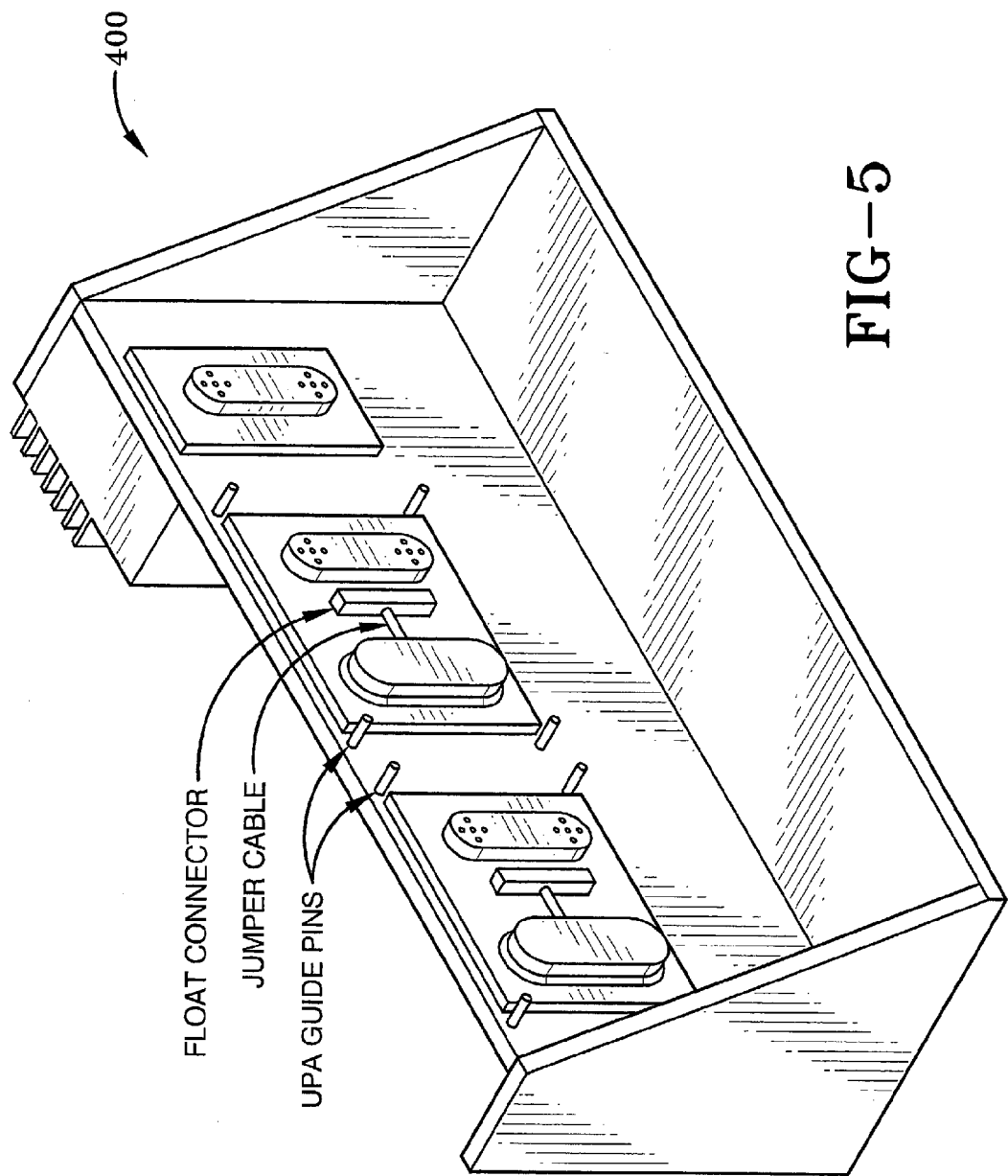

MODULAR MOUNTING AND INPUT/OUTPUT

CROSS REFERENCE TO RELATED APPLICATION

This application claims priority from U.S. Provisional Application Ser. No. 61/484,427, filed May 10, 2011 and U.S. Provisional Application Ser. No. 61/486,798, filed May 17, 2011; the disclosures of which are both incorporated herein by reference.

BACKGROUND OF THE INVENTION

1. Field of Invention

The current invention relates generally to apparatus, systems and methods for connecting electronic equipment. More particularly, the apparatus, systems and methods relate to connecting newer electronic modules with legacy electronic modules. Specifically, the apparatus, systems and methods provide for a dual connector plate that can connect a new electronic module that only requires one connector port with a legacy electronic module that requires two connector ports.

2. Description of Related Art

Complex projects that involve computers, networks, communication devices, security/encryption and the like are often developed over many years or decades. For example, the Department of Defense's (DoD's) Joint Tactical Radio System (JTRS), including its ground mobile radios (GMRs), is one such example system. The (JTRS) is considered a pivotal transformation program within the DoD and is a joint service initiative that addresses the growing need for integrated air, ground, and sea communications systems which enable a network-centric capability for joint taskforces and multinational coalitions to conduct efficient and effective military operations.

As part of the JTRS program, a next generation field able mobile ad hoc network was designed and implemented with up to 1620 moving nodes per self-forming, self-configuring, self-healing network. Called a Wide Band Networking Waveform (WNW), this networking stack will initially tie together all Army vehicles in a dynamic multi-hop network and will later be extended to directional links and other platforms such as those for the Air Force and Navy. The WNW represents the state-of-the-art in terms of balancing quickly realizable networking protocols for today's Army as well as incorporating DARPA-level innovations that allow the network to easily scale to thousands of nodes.

There are several advanced features of the DoD's JTRS program. For example, it has an open architecture designed to support DoD communications from the ground to the space environment. It is software-programmable, multi-band, multimode radio, interoperable across the spectrum of operations and across services. The JTRS program provides for improved connectivity through link availability and reliability. It has optimized bandwidth utilization while maintaining high security requirements; security through use of HAIPE (high-assurance IP-based encryption). It provides for network management, with rerouting and retransmission, that improves operator efficiency, reduces errors, and results in increased situational awareness, enabling rapid access to forces. Additionally, the JTRS program provides full multimedia communications: voice, data, and video throughputs unavailable in legacy systems. To allow for the development and improvement of this system over many years, the JTRS program provides for a capability-based technology-insertion migration path with modular, scalable design that reduces lifecycle costs.

However, even developing a large project over several years that has a capability-based technology-insertion migration path with modular, scalable design that reduces lifecycle costs still can have many problems that can slow down its progress. For example, while each of the ground Mobile Radios (GMRs) is a highly flexible communication system, its high processing capability consumes significant power resulting in heat that is dissipated using large heat sinks and fans for cooling. Given a novel cooling approach targeted to processing elements such as microprocessors, RF/analog circuitry and other electronic devices, it is possible to reduce its size and weight. Lower internal temperatures would also increase GMR reliability. While there are many cooling approaches, it must support operational and maintenance in a Military tactical environment that include altitudes up to 15,000-ft, operating temperatures −40° C. to +55° C., storage temperatures of −55° C. to +71° C., driving rain and dust storms, corrosive environments such as salt-sea atmospheres, and can withstand indirect shock. The system needs to be safe and promote easy operation and maintenance in these environments by trained military personal.

The main component of a GMR is a Joint Tactical Radio (JTR) which consists of a Ground Vehicular Adapter (GVA) and up to five Line Replaceable Units (LRUs). The GVA is the card cage to interconnect LRUs, providing backplane, backplane connectors, power supply and additional miscellaneous active circuitry consuming significant power. There are three main LRUs types that are plugged into the GVA, the Network Infosec Unit (NIU), the Universal Transceiver (UT), and a Power Amplifier (PA). Each LRU is enclosed to withstand an immersion in water requirement and has its own heat sink. The NIU consists primarily of digital circuitry with many high speed processing elements and draws approximately 110 Watts. The UT consists of both RF/Analog and digital circuitry with multiple high speed processing elements. There are multiple PAs consisting of primarily RF/Analog circuitry with at least one processing element for control. While newer electronic modules are available that improve over legacy electronic modules, the newer electronic modules are often incompatible with legacy chassis out in the field. A newer electronic module simply cannot be delivered to the field and connected to a legacy chassis. Therefore, a better way to connect newer electronic modules with legacy chassis is needed.

SUMMARY OF THE INVENTION

The preferred embodiment of the invention includes a connector plate for connecting an advanced electrical module to a legacy chassis. In one embodiment, a connector plate comprises a plate bracket, a module connector, at least two chassis connectors and route logic. The plate bracket has a front side, a back side and an opening. The module connector connects to an electrical module within the opening. The at least two chassis connectors are located on the back side of the bracket plate and are configured to be connected a legacy chassis or an advanced chassis. The legacy chassis and the advanced chassis do not expect signals from the same number chassis connectors. The route logic routes signals from the module connecter to each of the at least two chassis connectors.

In another configuration of the preferred embodiment, the connector plate can include a dummy connector. The dummy connector is located on the front side of the bracket plate provides physical support to another electronic module such as a power amplifier (PA). The dummy connector can have metallic plating that is a metal such as nickel and the dummy connector can be electrically grounded.

Other embodiments of the connector plate can include other useful components and features. For example, a sealing ring can be included on the front side of the plate bracket and around the opening on the plate bracket to create a water tight seal with the electrical module when the connector plate is connected to the electrical module. The connector plate can include a printed circuit board (PCB) with the routing logic printed on the PCB and with the chassis connector mounted on the PCB. The PCB can be placed between the at least two chassis connectors and the plate bracket. A gasket can be placed between the PCB and the at least two chassis connectors and sealing ring can be located between the mounting bracket and the back side of the mounting plate to provide a water tight connection between the gasket and the mounting bracket.

In another configuration, the connector plate chassis connectors include a first chassis connector and a second chassis connector. The routing logic includes wiring to route a first set of signals from the module connector to the first chassis connector and wiring to route a second set of signals from the module connector to the second chassis connector. The first set of signals can be radio transmit signals and the second set of signals can be radio receive signals.

Another configuration of the preferred embodiment is a system for connecting an electronic module to a legacy chassis. The system includes first and second connectors for connecting to two connectors on the legacy chassis. The system further includes a dual connector plate with a back side and a front side including a chamber with an opening in the front side of the dual connector plate. An electronic module connector extends at least partly from the back side into the chamber with the electronic module connector configured to connect to a complementary connector in the electronic module. Wires route signals from the electronic module connector to the first chassis connector and other wires route signals from the electronic module connector to the second chassis connector. The wires routing signals from the electronic module connector to the first chassis connector route different signals than the wires routing signals from the electronic module connector to the second chassis connector.

In other configurations, the system includes a filler device configured to fill a space not occupied by the electronic module when the electronic module is connected to the dual connector plate and the dual connector plate is connected to the legacy cassis. The filler device can be a block-shaped filler device and include air vent openings at least partially complementary and adjacent to cooling areas on the electronic module. Attachment devices such as screws can rigidly attach the filler device to the electronic module.

One example configuration of the system includes a blank connector on the front side of the dual connector plate and adjacent the opening. The blank connector is opposite the first chassis connector that is on the back side of the dual connector plate. The blank connector can be shaped to provide physical support to an electronic module the does not require an electrical connection to the blank connector.

Another configuration of the preferred embodiment is a method of connecting an electronic module to a legacy chassis. The method connects a connecter in the electronic module to an electronic module connector on a connector plate. The method connects a first chassis connector on the connector plate to a first connector on the legacy chassis and a second chassis connector on the connector plate to a second connector on the legacy chassis. At least one signal is routed from the electronic module connector to the first chassis connector and at least one signal is routed from the electronic module connector to the second chassis connector. At least one signal routed to the second chassis connector is different than at least one signal routed to the first chassis connector. For example, radio transmission related signals can be routed from the electronic module connector to the first chassis connector and radio reception related signals can be routed from the electronic module connector to the second chassis connector.

In one configuration of the method, the electronic module is positioned so that it is lined up with the first chassis connector and is behind the first chassis connector and is not lined up with the second chassis connector and is not behind the second chassis connector. The method can also attach a second electrical module to a dummy connector on the connector plate so that the second electrical module is lined up with and behind the second chassis connector and does not communicate any communication signals to the dummy connector. The dummy connecter can be grounded.

A spacer device can be attached to the electronic module to fill an area associated with the legacy chassis not occupied by the electronic module. The electronic module can be cooled through cooling paths cut into the spacer device.

The method can also include removing the electronic module and the connector plate from the legacy chassis. Next, a legacy electronic module that has first and second legacy connectors can be installed in the legacy chassis by connecting the first and second legacy connectors of the legacy electronic module to the first and second chassis connectors of the legacy chassis without using the connector plate.

Another example method of the preferred embodiment of the method includes a method of connecting an improved electronic module to a legacy chassis. The method includes removing a legacy module from the legacy chassis. The legacy module is an older module that communicates with legacy chassis through at least two legacy module connectors on the legacy module and at least two chassis connectors on the legacy chassis. Next, a connector plate with a front side and a back side is attached to the improved electrical module that communicates to the front side of the connector plate with fewer than the at least two legacy module connectors. The method attaches the connector plate and the improved electrical module to legacy chassis so that an equal number of connectors on the back side of the connector plate communicate with an equal number of legacy chassis connectors on the legacy chassis.

The attaching of the connector plate and the improved electrical module further includes attaching the improved electronic module behind some of the equal number of legacy chassis connectors on the legacy chassis so that it does not occupy area behind all of the equal number of legacy chassis connectors on the legacy chassis. A passive electronic module can be attached to a dummy connector on the connector plate so that the passive electronic module is directly behind at least one chassis connector that the improved electrical module is not directly behind. The dummy connector can be grounded so that the passive electronic module does not electrically communicate with the dummy connector.

BRIEF DESCRIPTION OF SEVERAL VIEWS OF THE DRAWINGS

One or more preferred embodiments that illustrate the best mode(s) are set forth in the drawings and in the following description. The appended claims particularly and distinctly point out and set forth the invention.

The accompanying drawings, which are incorporated in and constitute a part of the specification, illustrate various example methods, and other example embodiments of various aspects of the invention. It will be appreciated that the illustrated element boundaries (e.g., boxes, groups of boxes, or other shapes) in the figures represent one example of the boundaries. One of ordinary skill in the art will appreciate that in some examples one element may be designed as multiple elements or that multiple elements may be designed as one element. In some examples, an element shown as an internal component of another element may be implemented as an external component and vice versa. Furthermore, elements may not be drawn to scale.

FIG. 5 illustrates another possible configuration of connecting an electronic module to a legacy chassis with a jumper connector(s).

Similar numbers refer to similar parts throughout the drawings.

DETAILED DESCRIPTION

Figure 1:
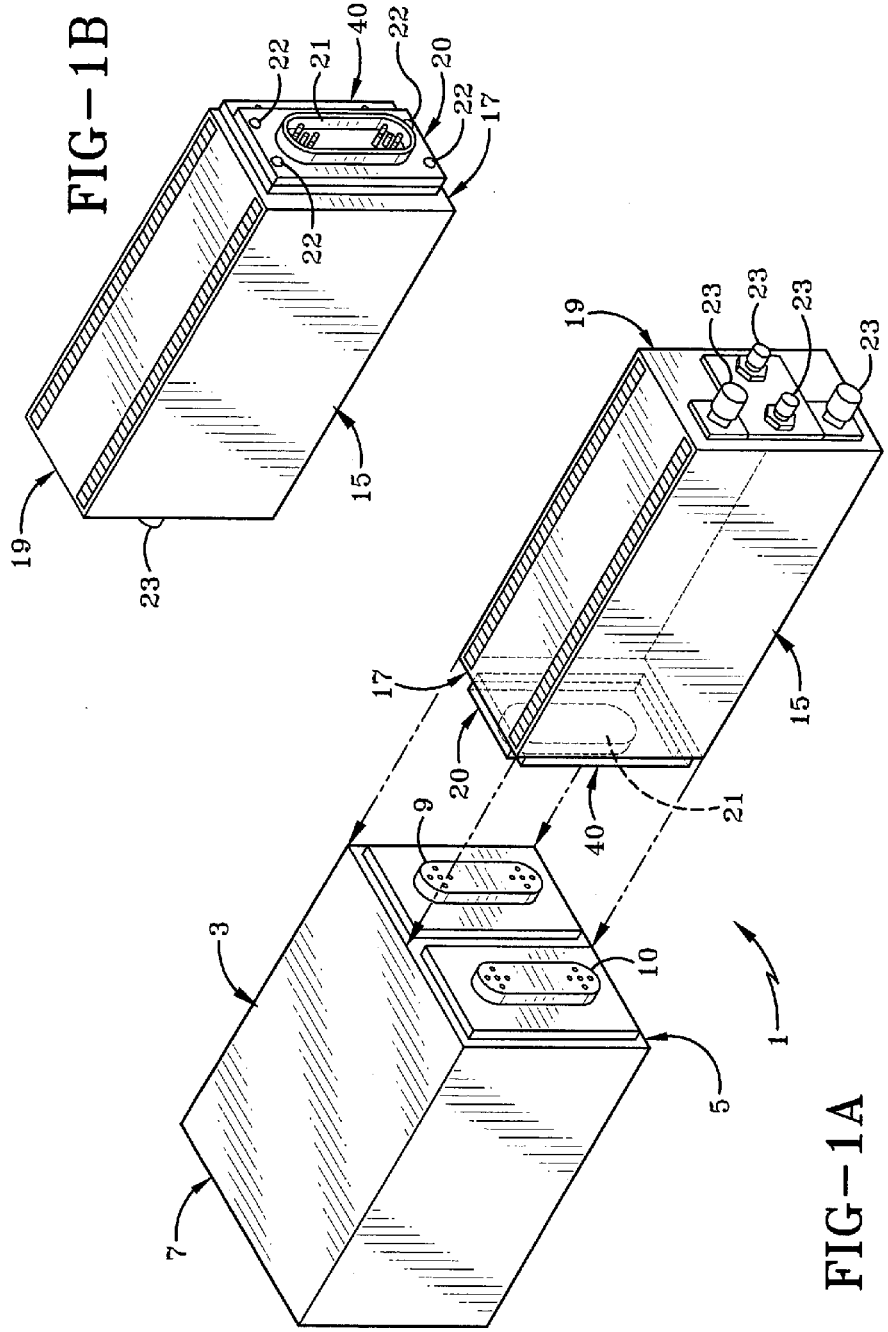
FIGS. 1A and 1B illustrate how an advanced electronic module can be connected to an advanced electronic chassis.

FIG. 1A illustrates an electronic system 1 that illustrates how an advanced electronics module 15 can be connected to an advanced electronic chassis 3. For example, the advanced electronics module 15 can be a transceiver that both transmits and receives wireless signals. The advanced electronics module 15 has a back end 17 and a front end 19. The back end 17 has a single connector 21 and the front end 15 can have one or more coaxial connectors 23. FIG. 1B illustrates a perspective view of the back end 17 of the advanced electronics module 15. This view also shows how connector 21 is mounted on a mounting bracket 20 that can be attached to the back end with bolts 22. Of course, in other embodiments, the front end 19 and the back end 17 can have other connectors and/or different types of connectors.

The advanced electronic chassis 3 has a front end 5 and a back end 7. The front end 5 is illustrated with two connectors 9, 10 but could be illustrated with a different number and/or different types of connectors. The advanced electronics module 15 can be attached to the advanced electronic chassis 3 by sliding the advanced electronics module 15 in the direction of the arrows so that the connector 21 of the advanced electronics module 15 lines up with connector 9 of the advanced electronic chassis 3. These units can be further pushed together so that these connectors are physically and electrically connected. For example (and as previously mentioned), the advanced electronic module 15 could be an advanced transceiver that contains both a transmitter and a receiver. The advanced electronic chassis 3 could be a modern unit that has connections for both transmitter signals and receiver signals at one connector (connector 9). The advanced base unit 3 may contain electronics for processing transmitted and received signal from the advanced electronic module 15.

However, often the electronic chassis that the advanced electronic module 15 is to plug into may be a legacy chassis.

As mentioned in the Background section, this can be because the electronic system that the advanced electronic module 15 is to plug into is a complex system developed and improved over years and decades. For example, the system may be similar to the DoD's Joint Tactical Radio System (JTRS) that can at any time be combination of legacy hardware/software and more advanced hardware/software. When the advanced electronic module 15 is to plug into a legacy electronic chassis, the legacy chassis will not function with the advanced electronic module 15. This is because, for example, that the legacy base electronic device is expecting transmitter signals to be received on one connector and receive signals on a separate second connector.

Figure 2:
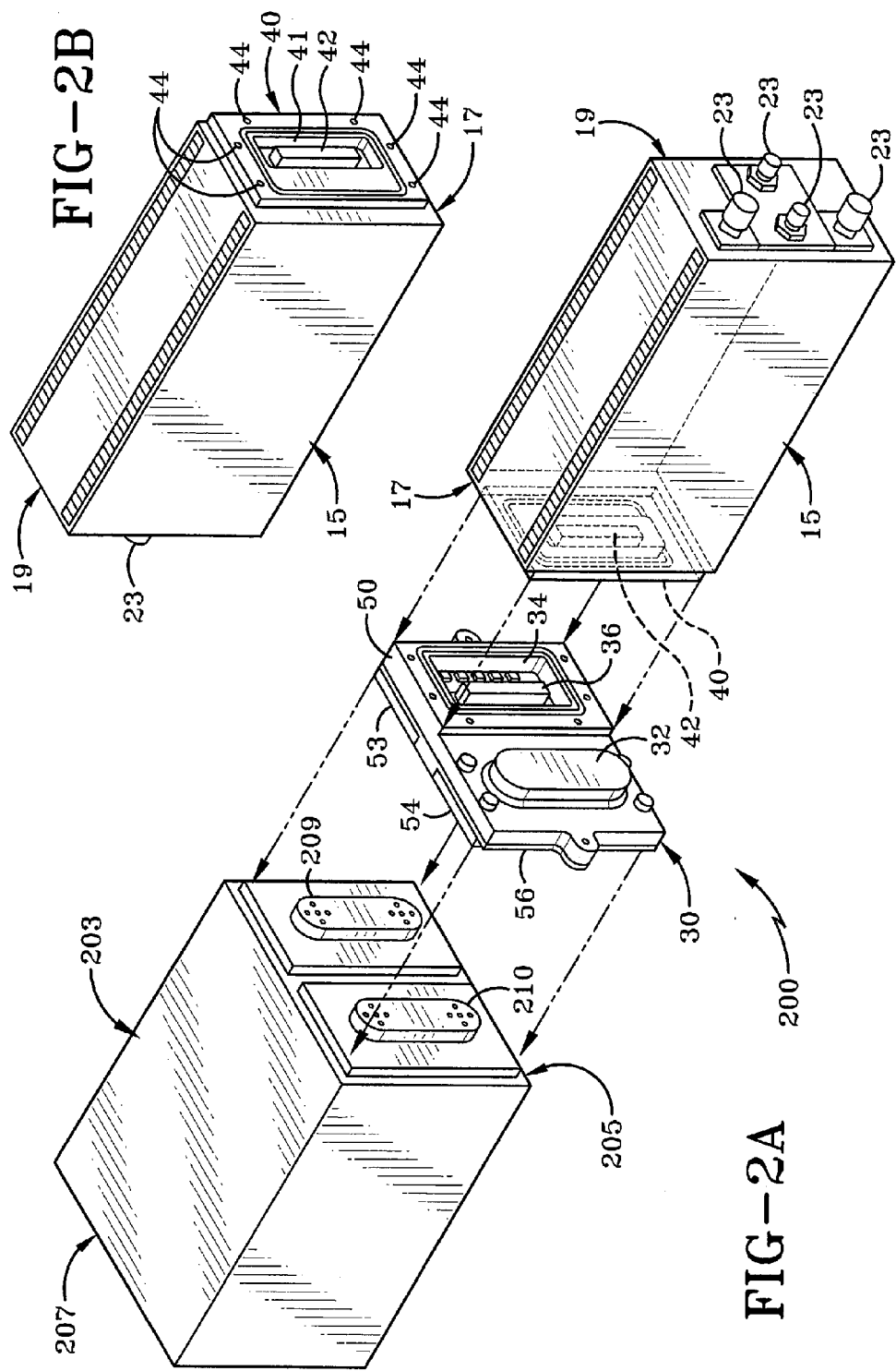
FIGS. 2A and 2B illustrate the preferred embodiment of how an advanced electronic module be connected to a legacy electronic chassis.

FIGS. 2A and 2B illustrate the preferred embodiment of an electronic system 200 that allows for connecting an advanced electronic module 15 (as discussed above with reference to FIGS. 1A and 1B) to a legacy electronic chassis 203. The connector 21 of the advanced electronic module 15 of FIGS. 1A and 1B has been removed and an adapter plate 40 is now visible as shown best in FIG. 2B. The adapter plate 40 has an opening 41 that provides access to an internal connector 42 of the advanced electronic module 15. The adapter plate 40 can be designed with a variety of screw holes 44 so that a variety of connectors and connector plates can be mounted onto the adapter plate 40. In order to allow different connector plates such as the dual connector plate 30 shown in FIG. 2A to be attached to the adapter plate 40, the adapter plate 40 can be shaped with different shapes and different screw hole patterns. This ensures that when the adapter plate 40 is used with auxiliary electronic devices they can communicate with a legacy electronic chassis 203 (when used with a dual connector plate attached to the adapter plate 40) or can communicate with an advanced electronic chassis 3 (without using a dual connector plate attached to the adapter plate 40).

The legacy electronic chassis 203 has a front end 205 and a back end 207. Two connectors 209, 210 are located on the front end 205. This example legacy electronic chassis 203 expects receive signals on connector 209 and transmit signals on connector 210. However, the advanced electronic module 15 supplies both transmit and receive signals on single internal connector 42 that cannot connect to both connectors 209, 210 of the legacy electronic chassis 203. To overcome this problem of connecting advanced hardware to legacy hardware, a dual connector plate 30 is used. The dual connector plate 30 includes a dummy connector 32 that is not electrically connected to anything; however, something can be physically connected to and supported by the dummy connector 32. The dual connector plate 30 also includes an opening 34 providing access to connector 36 that is mounted within the opening 34 of the dual connector plate 30. As discussed later, with reference to FIG. 3 the dual connecter plate may include a printed circuit board (PCB). Those of ordinary skill in the art will readily understand that some signals on the internal connector 42 of the advanced electronic module 15 can be connected through wiring on the PCB to the first connector 209 on the legacy electronic chassis 203. Similarly, other signals on the internal connector 42 of the advanced electronic module 15 can be connected through wiring on the PCB to the second connector 210 on the legacy electronic chassis 203. The connector plate 30 illustrates an example plate that is used to connect an advanced electronic module 15 with one connector 21 (FIGS. 1A and 1B) to legacy chassis 203 that is using/expecting two connectors 109, 110 (FIG. 2A). Of course, even though the Figures illustrate a connector plate used to merge two legacy base electronic device connectors for use with a single advanced auxiliary electronic device connector, more than two legacy base electronic device connectors could be merged to one or more advanced auxiliary electronic device connectors.

Having introduced the dual connector plate 30 and the adapter plate 40, it is helpful to now describe their use before describing their further details. In use, when the advanced electronic module 15 is to be connected to a legacy electronic chassis 203, the connector 21 (FIGS. 1A and 1B) of the advanced electronic module 15 is first removed. Next, the dual connector plate 30 is attached to the advanced electronic module 15 with screws or in another way. Now the advanced electronic module 15 and connector plate combination can be attached to the legacy electronic chassis 203 and the dual connector plate 30 ensures compatibility between the advanced electronic module 15 and the legacy electronic chassis 203.

Figure 3:
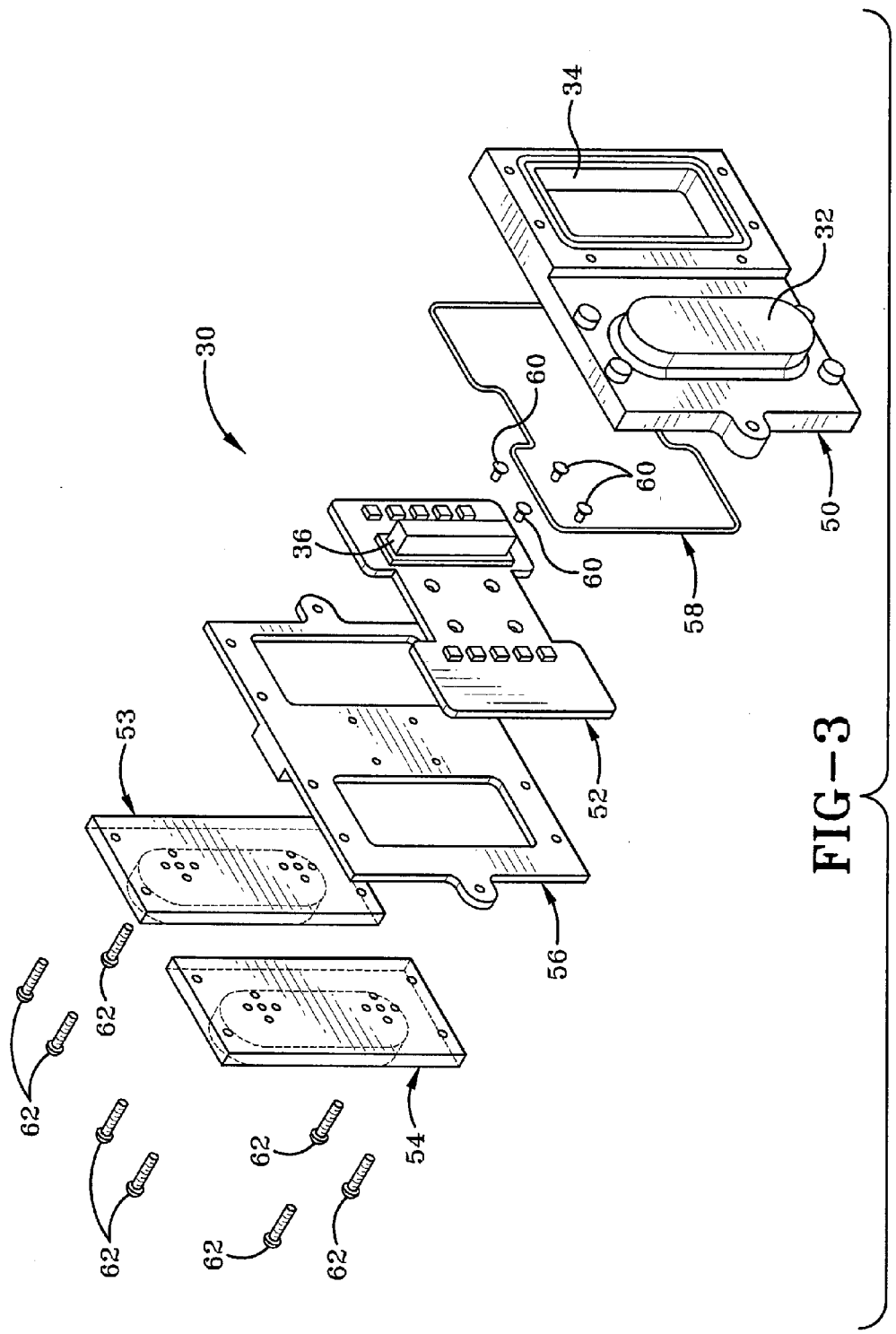
FIG. 3 illustrates an example exploded view of a dual connector plate.

FIG. 3 illustrates additional details of the preferred embodiment of a dual connector plate 30. The dual connector plate includes a dual connector plate bracket 50, a printed circuit board (PCB) 52, two external connectors 53 and 54, a gasket, a sealing ring 58 as well as the dummy connector 32 and opening 34 to connector 36 mentioned earlier. Connector 36 is mounted on the PCB 52 and one set of signals are brought from connector 36 to external connector 53 and another set of signals are brought from connector 36 to external connector 54. As mentioned earlier, the advanced electronic module 15 may be a transceiver with both transmit and receive signals at single connector 36 and the legacy electronic chassis 203 may be expecting receive related signals at connector 210 and transmit related signals at connector 209. In this example situation, the PCB 52 would be configured to bring the receive related signals from connector 36 out to connector 54 and the transmit related signals out to connector 53. As understood by those of ordinary skill in the art, wires on the PCB 52 can be used to bring the receive related signals from connector 36 to output connector 54 and other wires on the PCB 52 can be used to bring the transmit related signals from connector 36 to output connector 53.

When an advanced electronic module 15 is attached to the dual connector device 30 and plugged into the two connectors 209, 210 of the legacy chassis 203, there is an unoccupied space behind the dummy connector 32 and beside the advanced electronic module 15. However, some devices such as a power amplifier (PA) do not need to be electrically connected to the legacy chassis 203 and therefore a portion of the PA can be physically connected to the dummy connector 32 and occupy this unused space.

The PCB 52 is mounted between the gasket 56 and the dual connector plate bracket 50. The sealing ring 58 can be located between the gasket 56 and the dual connector plate bracket 50. The PCB 52 can be attached to the gasket 56 using screws 60 and the connectors 53, 54 and gasket can be attached to the dual connector plate bracket using other screws 62. The sealing ring 58 can be located between the gasket 56 and can create a dual connector plate 30 that when assembled is waterproof and airtight. For example, this may allow the dual connector plate to operate in a military tactical environment that include altitudes up to 15,000-ft, operating temperatures −40° C. to +55° C., storage temperatures of −55° C. to +71° C., driving rain and dust storms, corrosive environments such as salt-sea atmospheres, and withstand indirect shock.

Figure 4A:
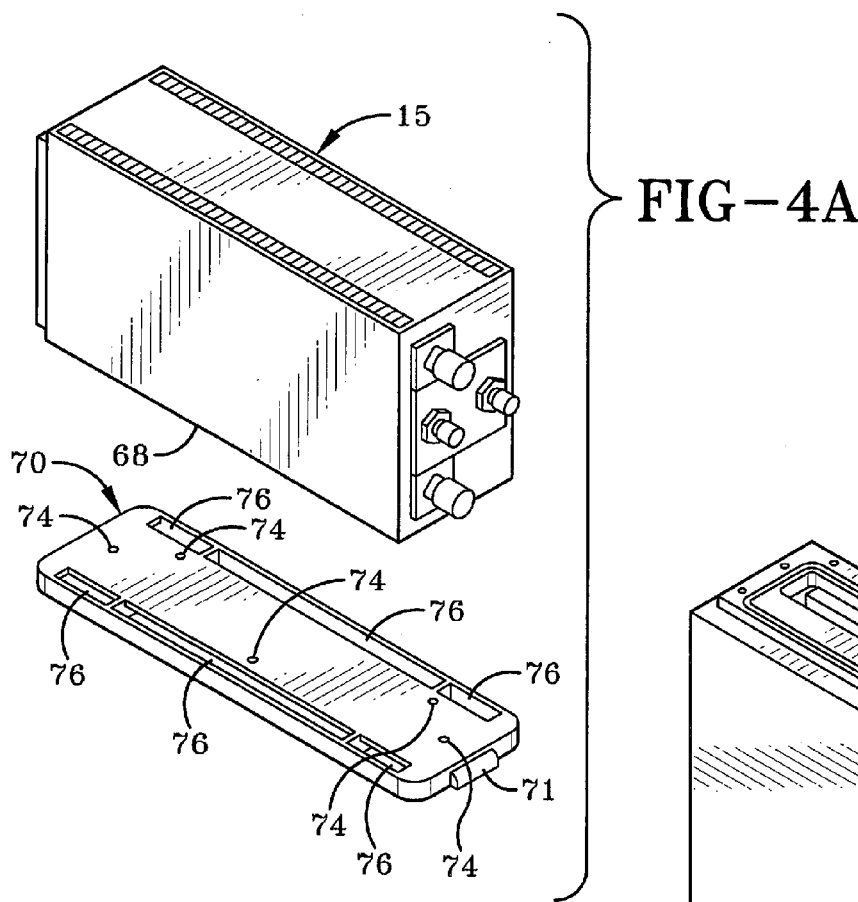
FIGS. 4A-B illustrate example views of two different mounting devices and FIG. 4C illustrates a surface of an electronic module where they could be mounted.

Sometimes an advanced electronic module 15 is to replace an older electronic module that was taller than the newer electronic module 15. In this case, there may be free space below the electronic module 15 after it is plugged into the legacy electronic cassis 203. To alleviate this problem, another configuration of the preferred embodiment uses an adaptive mounting device 70 as shown in FIG. 4A. This adaptive mounting device 70 is mounted onto the bottom side 68 of the advanced electronic module 15. For example, screws can be inserted through holes 74 and screwed into screw holes 69 on the bottom side of the adaptive mounting device 70. A lock tab 71 in combination with a thumb screw can be used to quickly fasten the electronic module 15 to the legacy electronic chassis 203. Air vents 76 can be formed in the adaptive mounting device 70 to ensure the electronic module 15 is still cooled. The adaptive mounting device 70 of FIG. 4A is used to fill about a half inch extra space below the electronic module 15. FIG. 4C illustrates an adaptive mounting device 80 that could be used to fill about four inch extra space below the electronic module 15. The device has a flange 82, screw holes 83 and vents similar to adapted mounting device 70.

Figure 4B:
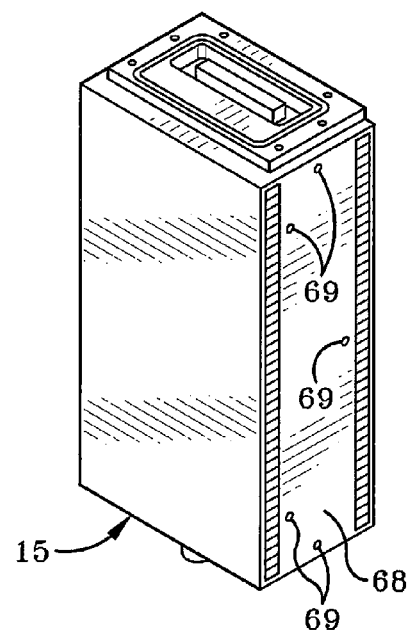
Figure 4C:
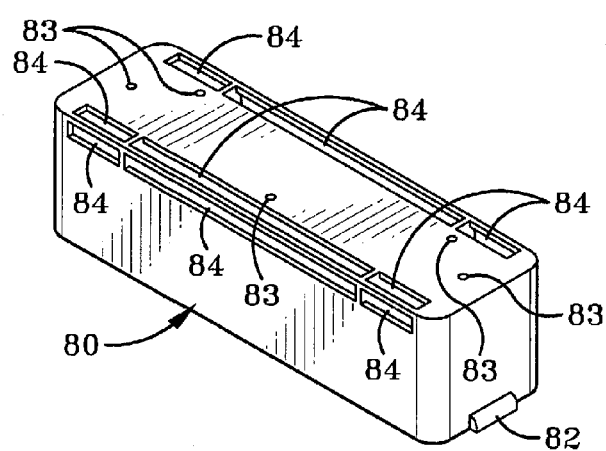

FIG. 4 illustrates an example system 400 of connecting a newer electronic module with a legacy chassis. The system includes a jumper cable, UPA guide pins and a float connector among other items. This figure is not discussed in any further detail.

Example methods may be better appreciated with reference to flow diagrams. While for purposes of simplicity of explanation, the illustrated methodologies are shown and described as a series of blocks, it is to be appreciated that the methodologies are not limited by the order of the blocks, as some blocks can occur in different orders and/or concurrently with other blocks from that shown and described. Moreover, less than all the illustrated blocks may be required to implement an example methodology. Blocks may be combined or separated into multiple components. Furthermore, additional and/or alternative methodologies can employ additional, not illustrated blocks.

Figure 6:
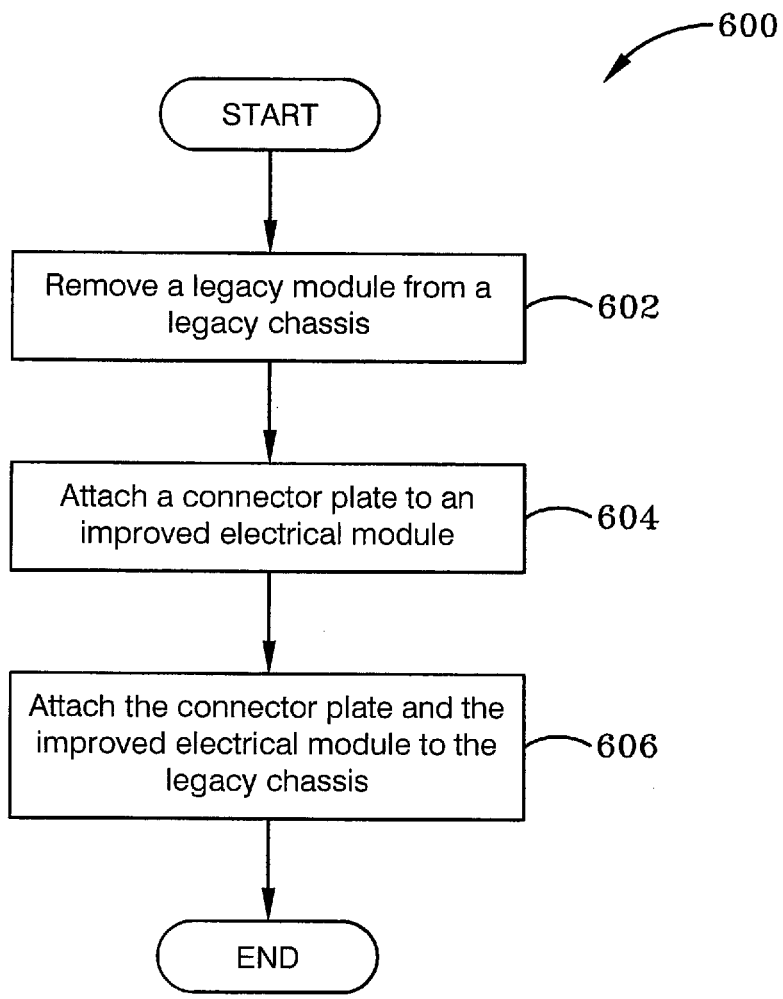
FIG. 6 illustrates an embodiment of a method for connecting an electronic module to a legacy chassis.

FIG. 6 illustrates the preferred embodiment as a method 600 of connecting an improved electronic module to a legacy chassis. The method 600 includes removing a legacy module from the legacy chassis, at 602. The legacy module is an older module that communicates with legacy chassis through at least two legacy module connectors on the legacy module and at least two chassis connectors on the legacy chassis. A connector plate with a front side and a back side is attached, at 604 to the improved electrical module that communicates to the front side of the connector plate with fewer than the at least two legacy module connectors. The method 600 attaches the connector plate and the improved electrical module to legacy chassis, 606, so that an equal a number of connectors on the back side of the connector plate communicate with an equal number of legacy chassis connectors on the legacy chassis.

The attaching the connector plate and the improved electrical module can further include attaching the improved electronic module behind some of the legacy chassis connectors on the legacy chassis so that it does not occupy area behind all of the legacy chassis connectors that the connector plate connects to on the legacy chassis. A passive electronic module such as a power amplifier (PA) can also be attached to a dummy connector on the connector plate so that the passive electronic module is directly behind at least one chassis connector that the improved electrical module is not directly behind. The dummy connector can be grounded so that the PA does not electrically communicate with the dummy connector.

In the foregoing description, certain terms have been used for brevity, clearness, and understanding. No unnecessary limitations are to be implied therefrom beyond the requirement of the prior art because such terms are used for descriptive purposes and are intended to be broadly construed. Therefore, the invention is not limited to the specific details, the representative embodiments, and illustrative examples shown and described. Thus, this application is intended to embrace alterations, modifications, and variations that fall within the scope of the appended claims.

Moreover, the description and illustration of the invention is an example and the invention is not limited to the exact details shown or described. References to "the preferred embodiment", "an embodiment", "one example", "an example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in the preferred embodiment" does not necessarily refer to the same embodiment, though it may.

What is claimed is:

1. A method of connecting an electronic module to a legacy chassis comprising:
   connecting a connecter in the electronic module to an electronic module connector on a connector plate;
   connecting a first chassis connector on the connector plate to a first connector on the legacy chassis;
   connecting a second chassis connector on the connector plate to a second connector on the legacy chassis;
   routing at least one signal from the electronic module connector through the connector plate, then through the first chassis connector on the connector plate, and then to the first connector on the legacy chassis;
   routing at least one signal from the electronic module connector through the connector plate, then through the second chassis connector on the connector plate, and then to the second connector on the legacy chassis, wherein the at least one signal routed to the second connector on the legacy chassis is different than the at least one signal routed to the first connector on the legacy chassis; and
   positioning the electronic module so that the electronic module is lined up with the first chassis connector and is behind the first chassis connector and is not lined up with the second chassis connector and is not behind the second chassis connector.

2. The method of connecting an electronic module to a legacy chassis of claim 1 comprising:
   attaching a second electrical module to a dummy connector on the connector plate so that the second electrical module is lined up with and is behind the second chassis connector and does not communicate any communication signals to the dummy connector.

3. The method of connecting an electronic module to a legacy chassis of claim 2 comprising:
   grounding the dummy connecter to a ground value.

4. The method of connecting an electronic module to a legacy chassis of claim 1 comprising:
   routing radio transmission related signals from the electronic module connector to the first chassis connector; and
   routing radio reception related signals from the electronic module connector to the second chassis connector.

5. The method of connecting an electronic module to a legacy chassis of claim 1 wherein the routing at least one signal from the electronic module connector to the first chassis connector further comprises:
   routing the routing at least one signal from the electronic module connector to the first chassis connector over wire on a printed circuit board (PCB).

6. The method of connecting an electronic module to a legacy chassis of claim 1 comprising:
   sliding a flange on the electronic module into a locking position relative to a frame associated with the legacy chassis and
   tightening a thumb screw to lock the electronic module to the legacy chassis.

7. The method of connecting an electronic module to a legacy chassis of claim 1 comprising:
   physically connecting the connector plate to the electronic module.

8. A method of connecting an electronic module to a legacy chassis comprising:
   connecting a connecter in the electronic module to an electronic module connector on a connector plate;
   connecting a first chassis connector on the connector plate to a first connector on the legacy chassis;
   connecting a second chassis connector on the connector plate to a second connector on the legacy chassis;
   routing at least one signal from the electronic module connector through the connector plate, then through the first chassis connector on the connector plate, and then to the first connector on the legacy chassis;
   routing at least one signal from the electronic module connector through the connector plate, then through the second chassis connector on the connector plate, and then to the second connector on the legacy chassis, wherein the at least one signal routed to the second connector on the legacy chassis is different than the at least one signal routed to the first connector on the legacy chassis; and
   removing the electronic module and the connector plate from the legacy chassis; and
   installing a legacy electronic module that has first and second legacy connectors by connecting to the first and second legacy connectors of the legacy electronic module to the first and second chassis connectors of the legacy chassis.

9. A method of connecting an electronic module to a legacy chassis comprising:
   connecting a connecter in the electronic module to an electronic module connector on a connector plate;
   connecting a first chassis connector on the connector plate to a first connector on the legacy chassis;
   connecting a second chassis connector on the connector plate to a second connector on the legacy chassis;
   routing at least one signal from the electronic module connector through the connector plate, then through the first chassis connector on the connector plate, and then to the first connector on the legacy chassis;
   routing at least one signal from the electronic module connector through the connector plate, then through the second chassis connector on the connector plate, and then to the second connector on the legacy chassis, wherein the at least one signal routed to the second connector on the legacy chassis is different than the at least one signal routed to the first connector on the legacy chassis; and
   physically connecting the connector plate, electronic module and chassis together so that the connector plate, electronic module and chassis are water tight.

* * * * *